United States Patent [19]

Isen et al.

[11] Patent Number: 6,010,771

[45] Date of Patent: Jan. 4, 2000

[54] ELECTRICAL CIRCUIT COMPONENT FORMED OF A CONDUCTIVE LIQUID PRINTED DIRECTLY ONTO A SUBSTRATE

[75] Inventors: Irvin Isen, Narberth; Joseph Kucherovsky, Philadelphia, both of Pa.

[73] Assignee: Bemis Company Inc., Minneapolis, Minn.

[21] Appl. No.: 09/023,419

[22] Filed: Feb. 13, 1998

Related U.S. Application Data

[63] Continuation of application No. 08/488,284, Jun. 9, 1995, Pat. No. 5,763,058.

[51] Int. Cl.⁷ ................... B41F 9/00; B41N 1/06
[52] U.S. Cl. ................ 428/209; 101/153; 118/46; 118/126; 118/212; 324/104
[58] Field of Search ............... 428/209; 101/150, 101/153; 118/46, 126, 212; 324/104

[56] References Cited

U.S. PATENT DOCUMENTS

| | | |
|---|---|---|
| 2,294,513 | 9/1942 | Pearson . |
| 3,450,044 | 6/1969 | Dixon .................................... 101/170 |
| 3,484,654 | 12/1969 | Honeiser ............................. 317/101 |
| 3,622,384 | 11/1971 | Davey et al. ....................... 117/212 |
| 3,630,835 | 12/1971 | Busch .................................. 162/184 |
| 3,808,680 | 5/1974 | Lafrate et al. ....................... 29/625 |
| 3,913,219 | 10/1975 | Lichtblau ............................ 29/592 |
| 4,009,087 | 2/1977 | Kardos et al. ..................... 204/52 R |
| 4,049,844 | 9/1977 | Bolan et al. ......................... 427/54 |
| 4,155,766 | 5/1979 | Hieber et al. ........................ 96/116 |
| 4,158,567 | 6/1979 | Hinma et al. ....................... 96/36.3 |
| 4,172,163 | 10/1979 | Magnotta ............................. 428/40 |
| 4,197,798 | 4/1980 | Bardin ................................ 101/153 |
| 4,200,044 | 4/1980 | Vested ................................ 101/170 |
| 4,217,263 | 8/1980 | Magnotta ........................... 260/29.8 |
| 4,239,001 | 12/1980 | Kataoka .............................. 101/152 |
| 4,313,986 | 2/1982 | Magnotta ............................. 428/40 |
| 4,363,071 | 12/1982 | Rzepecki et al. .................... 361/220 |
| 4,368,281 | 1/1983 | Brummett et al. ................... 523/458 |
| 4,371,459 | 2/1983 | Nazarenko ........................... 252/514 |
| 4,414,260 | 11/1983 | Rzepecki et al. .................... 428/212 |

(List continued on next page.)

FOREIGN PATENT DOCUMENTS

| | | |
|---|---|---|
| 0 450 938 | 3/1991 | European Pat. Off. . |
| 0 495 636 | 1/1992 | European Pat. Off. . |
| 0 497 617 | 1/1992 | European Pat. Off. . |
| 0 624 914 | 4/1994 | European Pat. Off. . |
| 0 624 915 | 4/1994 | European Pat. Off. . |
| 0 626 735 | 4/1994 | European Pat. Off. . |
| 0 789 406 | 1/1997 | European Pat. Off. . |
| 2534192 | 2/1977 | Germany ..................... B41N 1/16 |
| 57-12697 | 1/1982 | Japan ........................... B41N 1/00 |
| 59-232317 | 12/1984 | Japan ........................... G03F 7/02 |
| 62-134264 | 6/1987 | Japan ........................... B41F 31/02 |
| WO 92/14144 | 8/1992 | WIPO . |
| WO 96/42115 | 12/1996 | WIPO . |

OTHER PUBLICATIONS

A sample of static shield sheet believed to be made in accordance with U.S. Pat. No. 4,738,882.

Gibson, Richard, "Eastman Kodak Isn't Entitled to Patent For Battery Tester, U.S. Agency Rules," Wall Street Journal, col. 3, p. 2, Sec. B, Thursday, Jan. 8, 1998.

Printed Circuit Techniques by C. Bruneti and R.W. Curtis, National Bureau of Standards Circular 468 issued Nov. 15, 1947.

*Primary Examiner*—Deborah Jones
*Assistant Examiner*—Cathy F. Lam
*Attorney, Agent, or Firm*—Fitzpatrick, Cella, Harper & Scinto

[57] ABSTRACT

An article having an electrical circuit component printed directly onto one side of a substrate includes the substrate and an electrical circuit component formed of a conductive liquid printed directly onto one side of the substrate. The electrical component is capable of performing its electrical circuit functions, as printed, and without the necessity for post-printing processes such as metal etching, catalytic ink activation, or electroless deposition.

24 Claims, 6 Drawing Sheets

U.S. PATENT DOCUMENTS

| | | | |
|---|---|---|---|
| 4,470,883 | 9/1984 | Eichelberger et al. | 204/15 |
| 4,479,432 | 10/1984 | Masaki et al. | 101/170 |
| 4,484,250 | 11/1984 | Rzepecki et al. | 361/220 |
| 4,493,789 | 1/1985 | Ueyama et al. | 252/514 |
| 4,495,546 | 1/1985 | Nakamura | 361/749 |
| 4,526,474 | 7/1985 | Simon | 368/10 |
| 4,528,222 | 7/1985 | Rzepecki et al. | 428/35 |
| 4,555,414 | 11/1985 | Hoover et al. | 427/43.1 |
| 4,595,605 | 6/1986 | Martin et al. | 427/96 |
| 4,616,316 | 10/1986 | Hanpeter et al. | 364/413 |
| 4,617,557 | 10/1986 | Gordon | 340/568 |
| 4,646,634 | 3/1987 | Espe | 101/32 |
| 4,660,991 | 4/1987 | Simon | 368/10 |
| 4,666,735 | 5/1987 | Hoover et al. | 427/43.1 |
| 4,670,351 | 6/1987 | Keane et al. | 428/549 |
| 4,737,020 | 4/1988 | Parker | 350/351 |
| 4,738,882 | 4/1988 | Rayford et al. | 438/35 |
| 4,775,573 | 10/1988 | Turek | 428/209 |
| 4,801,514 | 1/1989 | Will et al. | 429/167 |
| 4,819,558 | 4/1989 | Counard | 101/348 |
| 4,835,475 | 5/1989 | Hanakura et al. | 324/435 |
| 4,911,994 | 3/1990 | Will et al. | 429/167 |
| 4,937,585 | 6/1990 | Shoemaker | 343/700 |
| 4,962,347 | 10/1990 | Burroughs et al. | 320/48 |
| 4,970,768 | 11/1990 | Lioy et al. | 29/121.8 |
| 4,981,074 | 1/1991 | Machita et al. | 101/35 |
| 5,011,627 | 4/1991 | Lutz et al. | 252/512 |
| 5,032,477 | 7/1991 | Will et al. | 429/167 |
| 5,033,377 | 7/1991 | Shimizu | 101/150 |
| 5,041,187 | 8/1991 | Hink et al. | 156/634 |
| 5,059,895 | 10/1991 | Cataldi et al. | 324/104 |
| 5,060,404 | 10/1991 | Lipford | 37/64 |
| 5,061,551 | 10/1991 | Durand | 428/209 |
| 5,127,330 | 7/1992 | Okazaki et al. | 101/450.1 |
| 5,131,141 | 7/1992 | Kawaguchi | 428/901 |
| 5,148,355 | 9/1992 | Lowe et al. | 361/410 |
| 5,201,268 | 4/1993 | Yamamoto et al. | 101/170 |
| 5,207,950 | 5/1993 | Ehrreich | 252/518 |
| 5,223,003 | 6/1993 | Tucholski et al. | 29/623.4 |
| 5,227,223 | 7/1993 | Morgan et al. | 428/209 |
| 5,231,268 | 7/1993 | Hall et al. | 219/10.55 |
| 5,231,356 | 7/1993 | Parker | 324/435 |
| 5,262,251 | 11/1993 | Will et al. | 429/167 |
| 5,292,566 | 3/1994 | Schacklett, III | 428/40 |
| 5,312,712 | 5/1994 | Will et al. | 429/167 |
| 5,326,654 | 7/1994 | Will et al. | 429/167 |
| 5,344,591 | 9/1994 | Smuckler | 252/511 |
| 5,355,089 | 10/1994 | Treger | 324/435 |
| 5,358,804 | 10/1994 | Will et al. | 429/167 |
| 5,362,513 | 11/1994 | Shimada et al. | 427/58 |
| 5,366,760 | 11/1994 | Fujii et al. | 427/96 |
| 5,368,953 | 11/1994 | Zaborney et al. | 429/90 |
| 5,389,458 | 2/1995 | Weiss et al. | 429/90 |
| 5,393,618 | 2/1995 | Weiss et al. | 429/90 |
| 5,403,649 | 4/1995 | Morgan | 428/209 |
| 5,405,487 | 4/1995 | Galchefski et al. | 156/566 |
| 5,407,741 | 4/1995 | Ota | 428/323 |
| 5,409,788 | 4/1995 | Weiss et al. | 429/93 |
| 5,436,091 | 7/1995 | Shackle et al. | 429/192 |
| 5,443,668 | 8/1995 | Zaborney et al. | 156/86 |
| 5,458,729 | 10/1995 | Galchefski et al. | 156/566 |
| 5,458,992 | 10/1995 | Bailey | 429/93 |
| 5,461,775 | 10/1995 | Tanabe | 174/259 |
| 5,478,665 | 12/1995 | Borroughs et al. | 429/90 |
| 5,503,876 | 4/1996 | Fields et al. | 427/286 |
| 5,538,806 | 7/1996 | Weiss et al. | 429/90 |
| 5,540,742 | 7/1996 | Sangyoji et al. | 29/623.5 |
| 5,596,278 | 1/1997 | Lin | 324/435 |
| 5,604,049 | 2/1997 | Weiss et al. | 429/93 |
| 5,626,978 | 5/1997 | Weiss et al. | 426/367 |
| 5,763,058 | 6/1998 | Isen et al. | 428/209 |

ELECTRICAL CIRCUIT COMPONENT FORMED OF A CONDUCTIVE LIQUID PRINTED DIRECTLY ONTO A SUBSTRATE

This application is a continuation application of application Ser. No. 08/488,284 filed Jun. 9, 1995, now U.S. Pat. No. 5,763,058 and entitled "APPARATUS AND PROCESS FOR DIRECTLY PRINTING AN ELECTRICAL CIRCUIT COMPONENT ONTO A SUBSTRATE"

BACKGROUND OF THE INVENTION

1. Field of the Invention

The present invention relates to an electrical circuit component formed of a conductive liquid printed directly onto one side of a substrate, and more particularly, to an electrical circuit component printed on the substrate without the need for post-printing steps such as metal etching, catalytic ink activation and/or electroless deposition.

2. Related Art

A wide variety of products contain electrical circuitry for carrying signals and/or power to perform communication, display, heating, computation, etc. Such electrical circuitry may be wired by hand, but is typically embodied in a printed circuit board installed in the product. Conventional printed circuit boards comprise a rigid, non-conductive substrate upon which conductive pathways (e.g., metal) have been formed.

Heretofore, a wide variety of processes have been used for forming the conductive pathways on the non-conductive substrate. For example, a metal film such as copper can be applied to a rigid, non-conductive substrate such as fiberglass and epoxy. In a commonly-employed process, a sheet of the conductive metal is laminated to the non-conductive substrate and a photoresist is then coated on the metal sheet. The resulting printed circuit board is subsequently exposed to a light pattern using a light mask to reproduce the metal pathway pattern desired. This exposure is followed by photoresist development and then metal etching in the area unprotected by the photoresist, thereby producing the desired circuit pattern. Alternatively, an etch resist can be directly printed such as by silk screen, gravure, or the like, on the metal laminate sheet followed by curing and then metal etching. Of course, this multi-step process is slow, time-consuming, labor-intensive, and quite expensive.

Another presently available process utilizes metals or metal salts dispersed as particles in a solution, usually in a polymeric binder, and the particles function as seed sites for subsequent plating with a metal. The polymeric composition containing the metal or metal salt is applied to a substrate in a desired pattern. The composition is then heat-cured in order to drive off solvent and to cross-link the polymer. The substrate is then submerged in a metal bath or solution where metal pathways grow between the seed sites. This multi-step process is also slow and expensive. Typical examples of such processes are disclosed, for example, in U.S. Pat. Nos. 3,900,320; 3,775,176; and 3,600,330.

It has also been proposed to form electrically conductive metal pathways by a process which includes coating a substrate with a composition containing a reducible metal complex. In one such process, a substrate is coated with a sorbitol copper formate solution containing a photoactivated reducing agent. Upon exposure to ultraviolet radiation, unmasked areas are reduced to copper metal and are suitable for plating nucleation sites. Non-exposed areas are washed clean and all copper formate is removed before plating can be carried out. Again, much time and expense are involved in such processes. Examples of this technology may be found in U.S. Pat. Nos. 4,268,536; 4,181,750; 4,133,908; 4,192,764; 4,167,601; and 3,925,578.

It is also known to produce a printed circuit board by silk-screen processes in which a silk screen is placed on top of a rigid substrate and ink is pushed through open areas of the silk screen onto the substrate. This, however, is not a direct printing process since the silk screen stencil must first be placed over the substrate, a high viscosity ink is then pushed through the screen onto the substrate, and then the silk screen stencil must be removed. There are several inherent problems in this process. Initially, the inks must be fixed so as not to flow through the screen except where pushed, yet they must be applied with sufficient quantity and thickness of ink to flow together after being applied to make a uniformly conductive surface. Furthermore, the speed of production is very slow with only a small quantity of printed circuit boards being produced with given period of time. In addition, the precision of the circuits is quite low since pulling the stencil away from the substrate causes dispersion at the edges. Silk screen processing cannot produce thin or narrow lines because of the high viscosity ink. Also, silk screen inks are quite expensive and difficult to process. Silk screen processes cannot be used to produce multi-layer printed circuit boards, and silk screen processes can only be used with rigid substrates since a firm backing is required to push the ink through the silk screen stencil and to remove the stencil. Even if these difficulties can be overcome, silk-screening is difficult or impossible to automate fully for high speed printing.

In another known process, catalytic inks are applied to a substrate and are subsequently activated for plating by electroless surface treatment with noble and/or non-noble metals or salts. Typical examples of these processes are shown in U.S. Pat. Nos. 4,089,993; 4,073,981; 4,100,038; and 4,006,047. The coated substrates are heat-cured and require elevated temperatures and long cure times. Again, such multi-step processes are quite expensive and time consuming.

A technique for producing a flexible anti-theft tag employing a resonant circuit is disclosed in U.S. Pat. No. 3,913,219. According to this technique, an electrically insulated substrate has sheets of conductive foil bonded to each surface thereof. The laminated substrate is next printed on both surfaces with a black carbon ink in the particular patterns required for resonant circuit anti-theft tags. The substrate is then etched to chemically remove all of the unprinted aluminum foil on both sides of the web. The resultant conductive patterns on both web surfaces may be interconnected by welding or by coupling together the conductive surfaces. The time and costs associated with such a technique are readily apparent.

In summary, known processes for producing electrical circuitry such as silk-screen, catalytic ink, chemical etching, electroless bath, etc. are expensive and time consuming. What is needed is a method and apparatus for inexpensive, high-speed production of electrical component-bearing substrates, and especially printed circuit boards.

SUMMARY OF THE INVENTION

An object of the present invention is to provide articles containing electrical components which are directly printed onto a substrate and are capable of performing their electric circuit function, as printed, without the need for post-printing processes such as metal etching, catalytic ink activation and/or electroless deposition.

According to an aspect of the present invention, a flexible, electrically-conductive article comprises a flexible substrate, and an electrical circuit component formed of a conductive liquid printed directly onto one side of the flexible substrate.

According to another aspect of the present invention, a web containing a plurality of printed circuit boards comprises a flexible substrate and a plurality of like electrically circuit components formed of a conductive liquid printed directly onto one side of the flexible substrate.

BRIEF DESCRIPTION OF THE DRAWINGS

The present invention will be fully understood from the following detailed description of presently preferred embodiments and the accompanying drawings, in which.

DETAILED DESCRIPTION OF PRESENTLY PREFERRED EXEMPLARY EMBODIMENTS

1. Introduction

The present invention employs a process we are calling the GRAVCO-PROCESS™ (The Gravco Inc. Process to be described below) to "directly print" an electrical circuit component onto a substrate. That is, the conductive liquid (which forms the electrical circuit component) is transferred directly from the surface of the liquid-carrier to the surface of the substrate; the electrical circuit component is thus directly printed onto the substrate and is capable of performing its electrical circuit function, as printed, and without post-printing process steps such as catalytic ink activation, electroless bath, silk-screen stencil removal, etching, etc., known in the prior art. Perforce, the GRAVCO-PROCESS™ is capable of producing electrical circuitry, such as printed circuit boards (flexible or rigid), using high-speed direct printing equipment known to those of skill in the art, such as rotogravure, flexographic, offset gravure, offset, and letter press, etc. The GRAVCO-PROCESS™ differs from known printing processes in that it can deposit directly, in one printing step, electrically-conductive liquid in a continuous pathway in the printing direction and in any direction oblique thereto. Since electrically-conductive pathways can be deposited continuously in any direction, high-speed, mass production printing equipment may be used for producing products such as printed circuit boards and their electrical components. Moreover, by depositing electrically-conductive liquid in any direction and in any configuration, a wide variety of electrical circuit components may be printed, such as signal lines, power lines, resistors, capacitors, resonant circuits, etc. Thus, the GRAVCO-PROCESS™ can produce highly-detailed, customized electrical circuits using high-speed mass-production printing techniques. With this invention, customized circuitry may be made at a fraction of the cost in a fraction of the time as compared to conventional printed circuit board technology.

A detailed description will now be provided of The Press; The Conductive Liquid; The Process; and The Articles according to the present invention.

2. The Press

Figure 1:
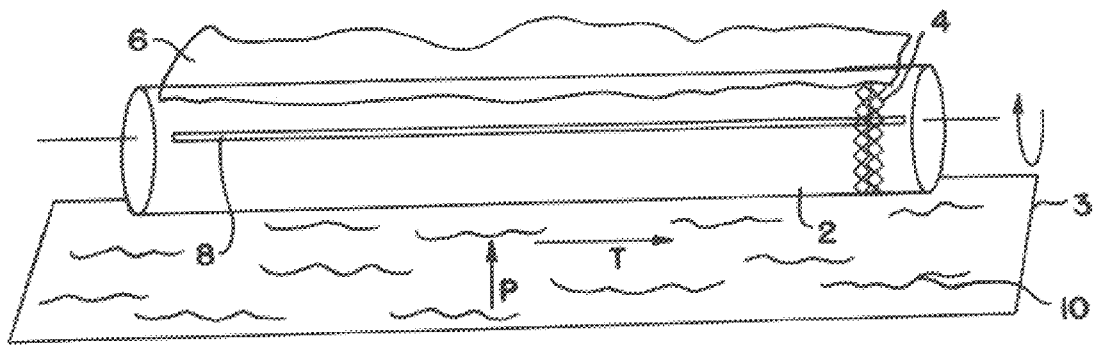
FIG. 1 is a schematic view of a direct printing station according to the present invention.

The printing station equipment (see FIG. 5) utilized in the GRAVCO-PROCESS™ may be direct printing equipment known to those of skill in the art, such as rotogravure, flexographic, offset gravure, offset, or letter press. The press itself may comprise a cylinder or a plate engraved or inscribed with an image (such as an electrical circuit and/or electrical circuit component) to be reproduced. The engraving holds a liquid to be applied to a substrate or web. According to the presently preferred embodiment, the press comprises a cylinder or roller 2 depicted in FIG. 1, the roller being usable at a rotogravure printing station. The roller 2 comprises a polished copper-plated steel cylinder typically 0.1–3.0 meters in circumference. The copper plate has a plurality of liquid-carrying cells 4 engraved around the circumference of the cylinder, as shown in exaggerated form in FIG. 1. Those of skill in the art know that the cells 4 may be engraved in the copper plate by techniques such as diamond-stylus engraving, chemical etching, laser inscribing, etc.

The roller 2 contacts a bath 3 of conductive liquid 10, and is rotated so that the liquid 10 adheres to the cells 4, is carried upward in the printing direction P, and is deposited on a substrate 6 (to be described below). A doctor blade 8 is mounted in the transverse direction T and scrapes against the cylinder surface to regulate the amount of ink carried on the roller 2 and to remove excess ink therefrom.

Figure 2:
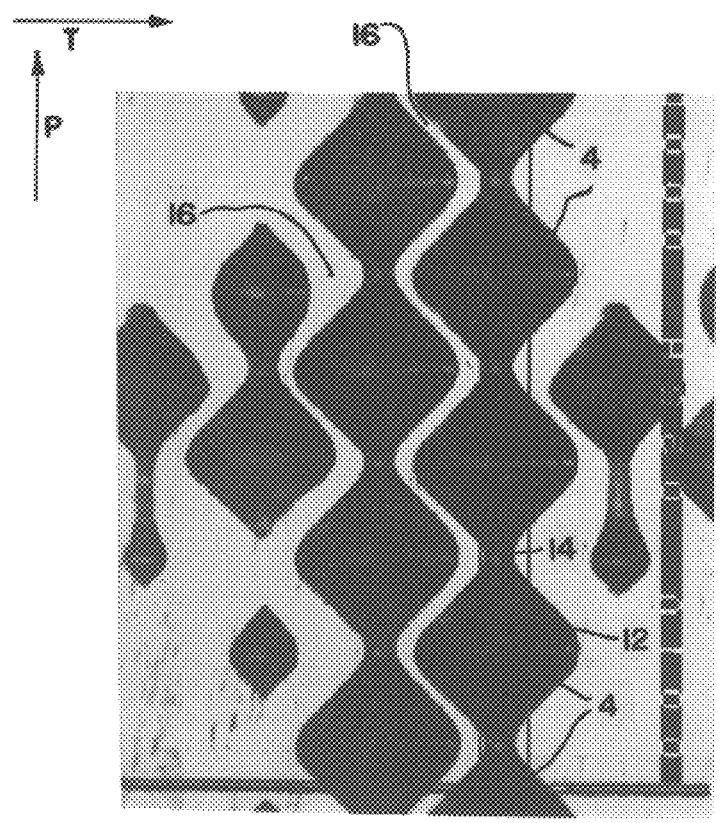
FIG. 2 is a close-up view of the engraving in a prior-art picture-printing cylinder.

FIG. 2 is a close-up view of prior art cells 4 engraved in a roller for performing prior art rotogravure picture printing. The plurality of cells 4 are connected together in the printing direction P—that is, circumferentially on roller 2. Each cell 4 is substantially 160 by 250 microns, and has a central portion 12 and a liquid communication portion 14 disposed in the printing direction P. While the central portion 12 of each cell 4 is deeper than the liquid communication portion 14 thereof, liquid ink nevertheless communicates readily in the printing direction from cell to cell. The cells 4 may be arranged with appropriate sizes, depths, and locations on the roller 2 to produce a pleasing picture when the ink is deposited on a substrate such as paper. While a black and white picture may require only one such roller, color pictures typically require four printing stations, one for each of red, blue, yellow, and black, the roller at each station bearing an appropriate array of cells for that color.

In FIG. 2, cell walls 16 are disposed so as to separate cells 4 in the transverse direction T. Ink must be prevented from flowing in the transverse direction T since this would produce a picture having unacceptable horizontal or diagonal lines therein. Furthermore, the cell walls 16 must support the doctor blade 8 which regulates the ink and removes excess ink from the roller.

Figure 3:
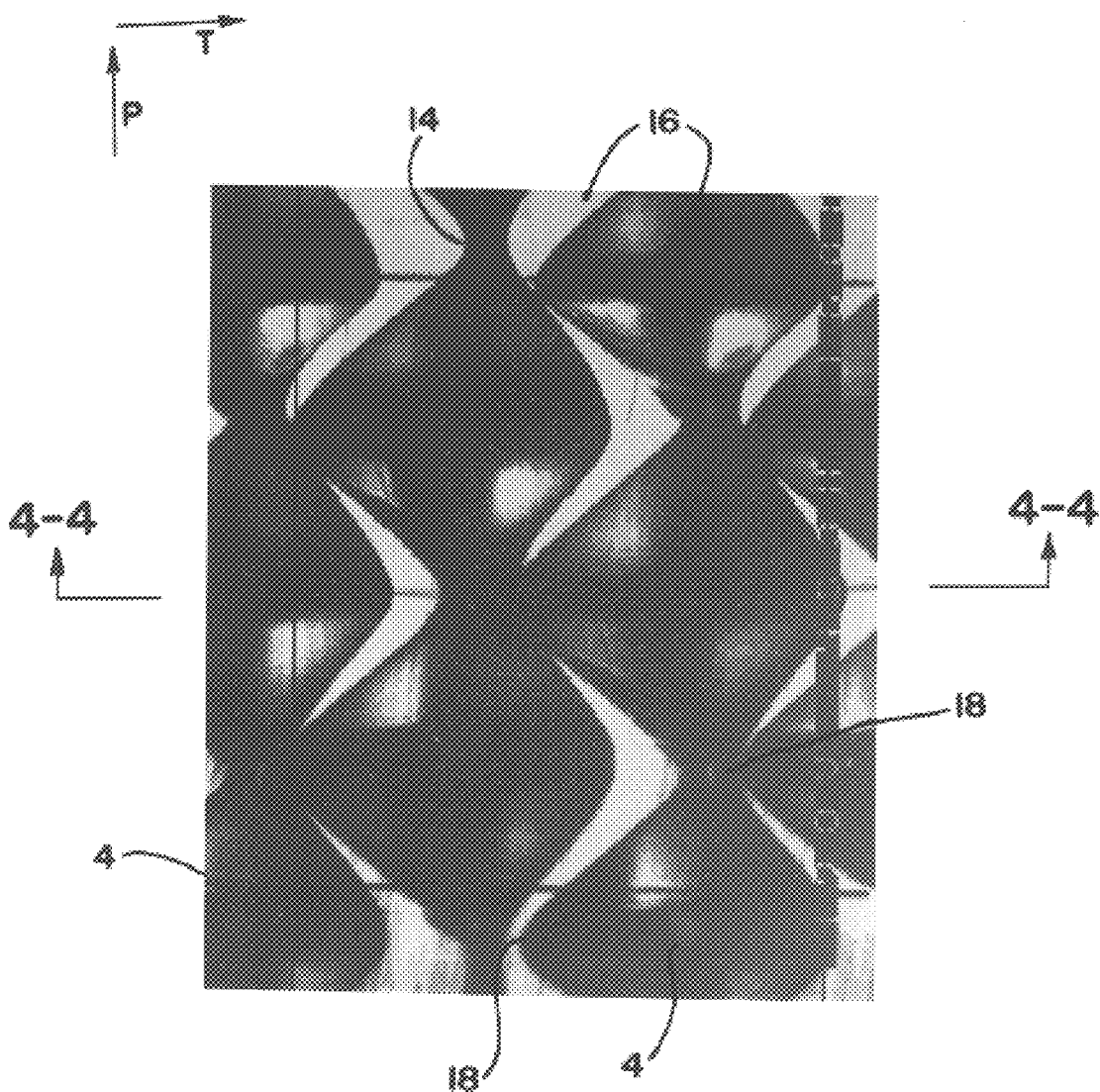
FIG. 3 is a close-up view of the engraving in a direct printing cylinder according to the present invention.

FIG. 3 is a close-up view of the arrangement and disposition of cells 4 according to the present invention. According to the present invention, liquid communication channels are also provided in the transverse direction T between adjacent cells. Preferably, each cell 4 also has a liquid communication portion 18 extending in the transverse direction or in a direction oblique thereto. According to the present embodiment, the transverse liquid communication portion 18 intersects the printing direction liquid communication portion 14 of an adjacent column of cells 4. In the printing process of this invention, conductive liquid according to the present invention (to be described below) is allowed to cross cell boundaries in both the printing direction P and the transverse direction T. Electrically conductive pathways can thus be configured in any direction parallel to or oblique to the printing and transverse directions.

In FIG. 3, the cell walls 16 are oriented at plus and minus 30–60 (preferably 45) degrees, respectively, with respect to the axis of roller 2. As the roller 2 rotates in the printing direction P, the thus-disposed cell walls 16 actually guide and regulate the flow of conductive liquid according to the present invention in the transverse direction to deposit an even and continuous layer of conductive liquid in any direction and in any configuration desired. The conductive liquid 10 from the bath 3 is picked-up by the cells 4 as the roller 2 rotates in the bath. Excess liquid is removed by the doctor blade 8, and the conductive liquid according to the present invention is carried to the substrate 6 where it is deposited directly thereon. While the central portion 12 of each cell 4 may be deeper than the liquid communication portions 14 and 18 thereof, when the liquid is deposited on the substrate 6, the free-flowing liquid according to the present invention tends to equalize readily in all areas where the solution contacts the substrate 6. Thus, uniform and continuous electrical pathways are formed on the substrate. The disposition of cell walls 16 depicted in FIG. 3 also provides support for doctor blade 8 in the transverse direction T around the entire circumference of roller 2.

Figure 4:
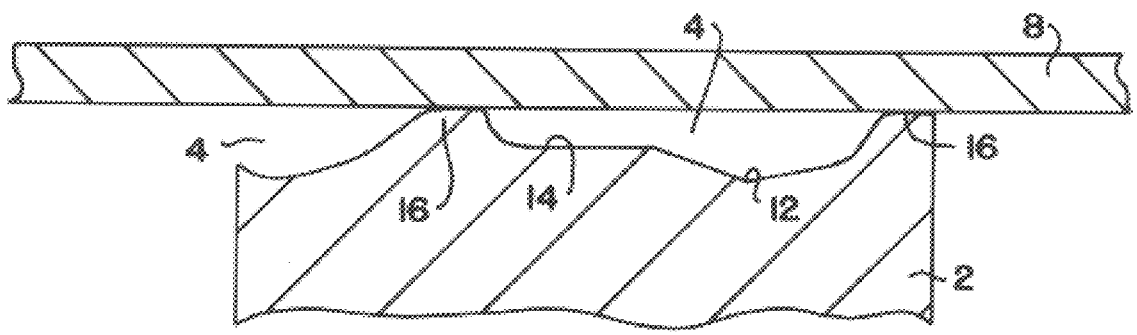
FIG. 4 is a cross-sectional view of the FIG. 3 cylinder taken along line 4—4 of FIG. 3.

FIG. 4 is a cross-section taken along line 4—4 of FIG. 3, and depicts the relationship between cell central portion 12, liquid communication portions 14 and 18, cell walls 16, and the doctor blade 8. Sufficient voids are provided in roller 2 below the doctor blade 8 to carry the conductive liquid 10 from the bath 3 to the substrate 6. The depth of central cell portion 12 is substantially 10–100 (preferably 40 microns), and the depth of liquid communication portions 14, 18 is substantially 20–60 (preferably 20) microns. Since the columns of cells 4 in the present invention are disposed much closer together in the transverse direction, approximately 200 columns of cells are provided per inch in the present embodiment, as compared to 165 columns of cells per inch in the prior art roller depicted in FIG. 2.

While the press according to the GRAVCO-PROCESS™ has been described above with respect to a roller similar to one used in rotogravure printing, it is to be understood that the press according to the present invention may comprise a flat plate, may be made of a photopolymer or plastic, and may utilize technology similar to rotogravures flexographic, offset gravure, offset, and letter press printing. All such similar and equivalent presses are, of course, included within the scope of the appended claims.

3. The Conductive Liquid

According to the present invention, the conductive liquid (including conductive paste) utilized to form the electrically-conductive pathways may comprise a solution, a suspension, or a paste having a viscosity substantially within a range of 10 to 50,000 cp; more preferably within the range of 10–200 cp; even more preferably within the range of 10–50 cp. The liquid preferably comprises (i) a solvent and/or water (or a combination of solvent and water), solids (ii) (resins and conductive powder), and (iii) plasticizers. Solventless liquids may also be used and oligimers will replace the solvent and/or water.

Preferably, the solvent comprises between substantially 55 percent and substantially 85 percent by weight of the liquid. (If water is used, it will comprise 25–65 percent by weight of the liquid). Even more preferably, the solvent is between substantially 65 percent and substantially 80 percent by weight; and even more preferably between 70 and 75 (most preferably 72) percent by weight of the liquid. The solvent preferably includes esters, ether glycol, and ketones. Between substantially 60 percent and substantially 95 percent by weight of the solvent are esters or equivalents. The most preferred embodiment includes 80 percent by weight of esters in the solvent. The solvent also should include between substantially 3 percent and substantially 20 percent, by weight ether glycols, and most preferably 10 percent. Finally, the solvent includes between substantially 3 percent and substantially 20 percent by weight of ketones, most preferably 10 percent. Of course, water-based dispersions could be used in lieu of the solvent-based solution. In this instance, wetting agents and foam suppressors, known to those of skill in the art, may also be used.

The preferred conductive liquid also includes between substantially 10 percent and substantially 40 percent by weight of solids, most preferably 25 percent. The solids preferably include substantially 5 percent to substantially 90 percent (preferably 20 percent to 90 percent) by weight of polymer resin (polyester)—a polar resin. Preferably, the polymer resins comprise 72 percent by weight of the solids.

The solids preferably include between substantially 3 percent and substantially 80 percent (preferably 10 percent to 80 percent) by weight of a conductive powder, most preferably 28 percent. The conductive powder comprises particles in the range of substantially 3 to substantially 50 (preferably 5–10) microns in diameter and may comprise aluminum, graphite, gold, silver, carbon, or other known conductive materials, or any combination thereof. The choice of conductive powder will vary in accordance with the component being designed, the width and thickness of the printed electrical pathway, and the current required to be carried therethrough.

Additionally, the conductive liquid according to the present invention preferably includes between substantially 1 percent and substantially 7 percent by weight, and most preferably between 2 and 3 percent by weight, of plasticizers. A preferred plasticizer is Dioctylphatalate.

Equivalents of the above-described electrically-conductive liquid may include water in addition to or as a replacement for the solvent. When replacing the solvent, the water comprises 25–65 percent by weight of the liquid. Solventless liquids can also be provided where oligimers replace the solvent and comprise substantially 25–60 percent by weight of a liquid. In this formulation, the conductive powders comprise 15–50 percent by weight of the liquid, and the plasticizers preferably comprise 1–5 percent by weight of the liquid. The oligimers may be activated by heat, light, electromagnetic radiation, etc.

The conductive liquids described above are merely illustrative and are designed to be used in signal lines for carrying low-power signals in the printed electrical circuit. Of course, a wide variety of solutions, suspensions, and/or pastes may be adapted depending upon the use for which the circuit component is designed. For example, signal lines and power lines will be highly-conductive. On the other hand, liquids used to print resistors will have a much lower conductivity. Magnetic liquids may be used to prepare inductive circuits, and electroluminescent liquids may be used to produce light-emitting circuitry. Of course, all such equivalent conductive liquids are encompassed by the present invention.

Furthermore, pigments may also be included in the conductive liquid to provide ornamental as well as functional features. Thus, not only may the conductive liquid perform an electrical circuit function, it may also be used as a label to provide information regarding the source of the goods or the product contained within the package. For example, an electrical circuit used in a child's toy may be arranged so that the circuitry spells out the toy name and/or toy instructions.

In a preferred embodiment, a conductive liquid for use in directly printing signal lines may be manufactured by pouring into a container substantially 88 percent by weight of the final liquid of AQUADAG™ liquid produced by Acheson Colloids Co., 1600 N. Washington, Port Huron, Mich. In a separate container, ½–2 percent by weight of plasticizer (preferably Dioctylphatalate) is premixed by hand at ambient temperature with 10 percent by weight of solvent, esters, and/or ether glycol. After premixing the plasticizer and solvent, the premix is added to the AQUADAG™ and mixed by air mixer for 15–20 minutes.

4. The Process

Figure 5:
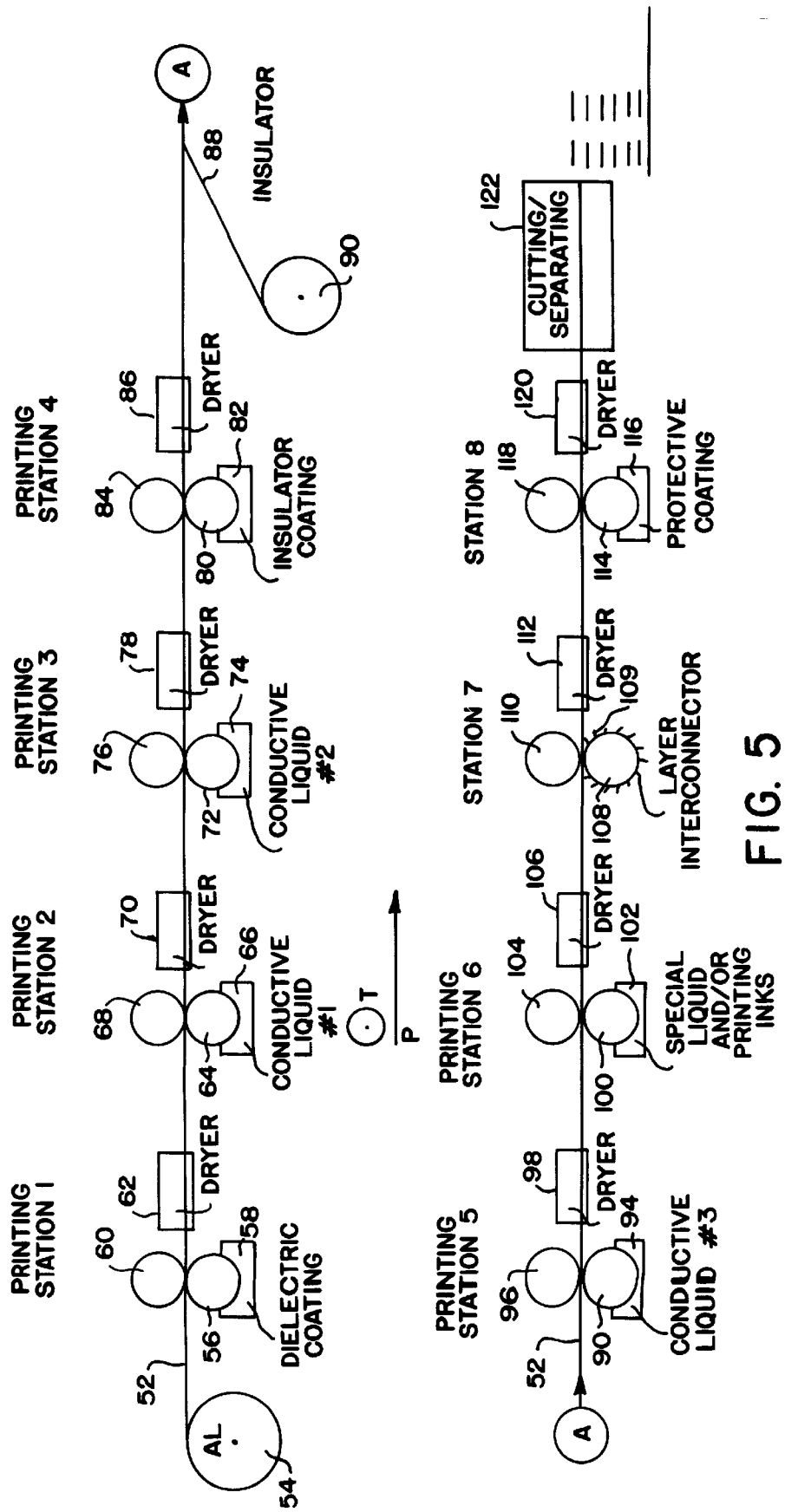
FIG. 5 is a schematic view depicting the apparatus and process for producing directly-printed electrical components.
Figure 6:
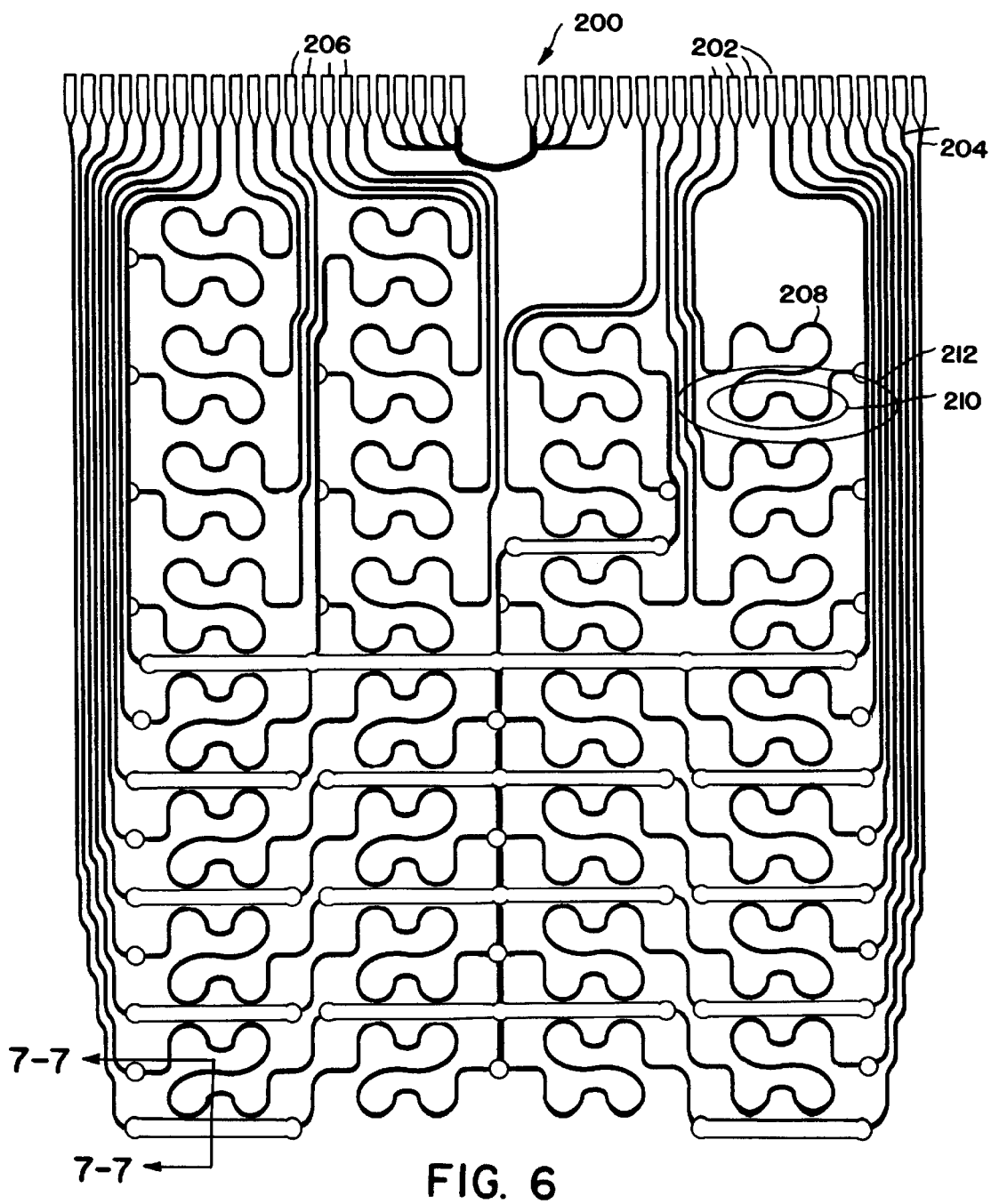
FIG. 6 is a plan view of an electrical circuit produced according to the present invention.

The GRAVCO-PROCESS™ for directly printing an electrical circuit component onto a substrate is schematically depicted in FIG. 5. The process will be described with reference to the manufacture of a computerized pill dispenser article which is depicted in FIG. 6. Such an article is used to monitor and schedule the dispensation of drugs in pill form. In FIG. 6, a pill in a plastic blister is disposed over top of each curved conductor line. The substrate beneath the conductor line is aluminum foil or some other easily-tearable surface. The pill dispenser is placed in a computerized monitoring device (not shown), and the device will send signals through the signal lines to determine the electrical continuity of each line. As each pill is dispensed, it is pushed downward through the aluminum substrate, severing the signal line to indicate that that pill has been dispensed. A display on the device will indicate which pills have been dispensed and when; the display may also indicate when the next pill should be dispensed. Where the pill dispenser has on-board signal generating, memory, and display circuitry, it is even possible for the dispenser itself to determine the time at which the pill was dispensed, and the time the next pill is scheduled to be dispensed.

The process of FIG. 5 feeds a substrate (web) of 1 mil aluminum foil 52 from a roller 54 to printing station 1 which is configured similar to a well-known rotogravure printing station. At printing station 1, a roller 56 sits in a bath of dielectric coating 58 and rotates to deposit a thin but continuous layer of dielectric over the bottom surface of aluminum sheet 52. The dielectric coating is preferably a polymer resin and solvent solution 10 microns thick which prevents any electrical contact with the aluminum sheet 52. A pinch roller 60 is disposed on the other side of aluminum foil 52 and ensures a uniform dispersal of dielectric coating on the aluminum sheet 52.

Printing station 1 also includes a dryer 62 which dries the dielectric coating on the sheet 52. The dryer may comprise a hot air oven (5 feet long @ 200° C.) directing an air blast at the foil for 0.5–1.5 seconds.

After exiting printing station 1, the sheet 52 is fed to printing station 2 where a roller 64 (for example, the roller 2 described above) sits in a bath 66 of conductive liquid #1 at ambient temperature. Since the conductive liquid may contain powders, an ink agitation system may be used in bath 66. This first conductive liquid will be used for signal lines, power lines, and other high-conductivity uses, and may comprise the conductive liquid described above. The roller 64 will have a pattern of cells 4 disposed in the printing direction P, in the transverse direction T, and in any directions oblique thereto. Preferably, the roller 64 is wide enough to simultaneously print seven electrical circuits as depicted in FIG. 6. Again, a pinch roller 68 will ensure a proper printing, and a dryer 70 will dry the conductive liquid #1. While the dryer 70 may comprise a hot air oven, as described above, preferably it is a microwave or radio frequency generator (e.g., 27 megahertz) which will dry the conductive liquid internally and not just the skin, which is a problem with air dryers. Thus, at printing station 2 the electrical circuit and its components are directly printed in a single operation without the post-printing operations described earlier.

At printing station 3, a print roller 72 will apply conductive liquid #2 from bath 74 onto the sheet 52. Conductive liquid #2 is less conductive than liquid #1 and is used to deposit components such as resistors. Again, a pinch roller 76 and a dryer 78 are used to print and dry the conductive liquid #2. Alternatively, printing station 3 could apply an additional layer of conductive liquid #1 over the previous layer to form a thick circuit, such as a power line.

Where the circuits require an insulating layer to be deposited on top of conductive liquids #1 and #2, a printing station 4 may be provided. At printing station 4, the print roller 80 sits in a bath of insulator coating 82 (such as a lacquer) to deposit a specified thickness of insulation over top of the conductive liquids. The insulator coating is deposited at any thickness required by the circuit. For example, to form a capacitor, the insulator layer may be 1 micron to 1000 (preferably 500) microns thick. However, if a push-pad switch is being produced, the thickness of the insulator layer may be less, such as 10 microns. As with the previous printing stations, printing station 4 includes a pinch roller 84 and a dryer 86.

Alternative to printing station 4, or in addition thereto, a laminating insulator material 88 may be applied from a roller 90. For example, the insulator 88 may comprise paper, polymeric plastic, or any other flexible insulating substrate or web. The insulator 88 may have holes or electrically conductive patterns therein to allow electrical contact between the conductive liquid #1 and later-deposited conductive layers, if desired. The holes in insulator 88 may be small enough so that contact is only established by pushing the two conductive layers together through the insulator 88 to produce, for example, a push-pad switch. In addition to laminating an insulator material, a roller may be provided for laminating one or more conductive layers (such as metallic foil) for additional signal or power channels, or for radio frequency shielding, as desired. Specific circuit details will be described later.

In FIG. 5, the sheet 52 is then transported to printing station 5 where a print roller 90 applies conductive liquid #3 from a bath 94 to the sheet 52 on top of the insulating layer. Conductive liquid #3 may comprise a highly-conductive liquid similar to conductive liquid #1. Again, this liquid may be used for upper-layer signal lines, power lines, capacitors, etc. A pinch roller 96 and a dryer 98 are also provided at printing station 5. Again, one or more layers of conductive liquid #3 may be printed, as desired.

If desired, a printing station 6 may be provided wherein any one or more of specialty liquids and/or printing inks may be applied. For example, special effects liquids may be provided such as thermochromic liquids, electrophosphorescent liquids, magnetochromic liquids, electrochromic liquids, zinc oxide (glow-in-the-dark) liquids, electroluminescent liquids, magnetic liquids, etc. If desired, more than one printing station may be provided for applying a series of such specialty liquids. In addition to, or as an alternative to the specialty liquids, graphic printing inks may be provided for affixing well-known labels, instructions, or decorations to the product. These inks may include conductive liquid so that the graphic image may comprise an electrical circuit and/or component. At the printing station 6, a print roller 100 transfers the specialty liquid and/or the printing ink from a bath 102 and applies it to sheet 52 aided by a pinch roller 104 and a dryer 106.

At station 7, a spiked roller 108 is used to provide appropriate layer interconnects between the upper and one or more lower layers of conductive liquid. Each spike 109 will penetrate through the conductive liquid #3, the insulating layer, and the conductive liquid #1 and/or #2 to make an electrical contact between the upper and lower conductive layers. If dryers 98 and 106 are not activated (or are preferably modulated), the conductive liquid #3 will still be in liquid or semi-liquid form when spike 109 penetrates through the insulating layer to the lower conductive layer. The conductive liquid will move through the interconnect hole and make a good electrical contact with the lower conductive layer. Preferably, the spiked roller will be disposed before the upper conductive layer printing station so that the printing of the upper layer will force liquid under pressure into the interconnect hole. Of course, the number, location, and depth of each of these spikes 109 may be specially designed depending upon the particular circuit which is being manufactured. As an alternative, the roller 108 may sit in a bath (not shown) of conductive liquid to further enhance the inter-layer electrical contact. At station 7, the spiked roller may be a punch roller press, a male-female die; or a backing roller or other device 110 may be used to provide proper support for the penetrating spikes 109. A dryer 112 may be used, if desired, to dry the conductive liquid connecting the conductive layers. Alternatively, crimps, rivets or other electrical conductors (preferably those which can be installed in an in-line process) may be used to electrically couple two or more conductive layers.

Station 8 is equipped to provide a protective coating over the top of the finished electrical circuit. The roller 114 applies a protective coating from bath 116 to cover the surface of the finished product. The protective coating may comprise lacquer, polymeric plastic, etc. A pinch roller 118 (or smoothing bar) and a dryer 120 may be provided, if desired. A cutting/separating unit 122 may be provided to cut, separate, and stack separate electrical circuits. Alternatively, the sheet containing the printed circuit boards may be rewound onto another roller for shipping and subsequent processing. These units are reasonably well known to those of skill in the art and will not be described in further detail herein.

The process described above with respect to FIG. 5 is capable of infinite variation depending upon the electrical circuit being produced. For example, three, four, or five conductive layers may be provided with (or without) interspersed insulating layers. Conductive liquids may be printed on top of each other to build thick components, e.g., 5 layers for a power line. The spiked roller 108 may be provided at any station or in between stations depending upon the interconnections required among the various conductive layers (e.g., to interconnect layers 1 and 2, and then 4 and 5). The insulating layers may be transparent or may be light-blocking. The type of conductive liquid and the pattern dimensions may be adjusted to achieve desired electrical characteristics such as resistance ohms, capacitor picofarads, the wattage of any power line, current, inductance, reactance, etc. The characteristics of the insulator coatings may be chosen for desirable insulating properties such as breakthrough voltage, tangent losses, etc. Additional aluminum sheets and/or conductive layers may be inserted via roller, as with the insulator roller 90, at any point in the process. The aluminum sheet may act as a ground plane for all of the electrical components, or may carry power to all of the circuits disposed above the dielectric layer, or may shield the circuit from electromagnetic or static electric interference.

As another alternative, an additional station (not shown in FIG. 5) may be provided at any point in the process for checking the quality of the already-printed circuits. For example, a roller may be provided having a plurality of electrodes disposed thereon which are arranged (registered) to come into contact with appropriate terminals on the sheet 52 passing beneath the roller. The electrodes on the roller will be activated (pulsed) to run continuity checks, resistance checks, voltage checks, amperage checks, etc., through the terminals in contact with the roller electrodes, etc. High-speed in-line quality checks will ensure a highly reliable product by quickly identifying failed circuits for removal at cutting/separating device 122. Alternatively, defective products may be marked as the sheet 52 is being rewound.

As yet another alternative, the process depicted in FIG. 5 may be "looped" from station 8 back to station 1 so that further additional conductive and insulating layers may be deposited and interconnected, as required.

As a further alternative, the electrical circuit may be formed on a flexible substrate (such as a 1 to 15 (preferably 1) mil thick polymeric plastic), and then bonded to a rigid substrate, such as an epoxy-fiberglass composite. Such a product is still far less expensive to produce than the known methods of producing known rigid printed circuit boards.

While the substrate depicted in FIG. 5 comprises a flexible aluminum foil, other flexible substrates may be utilized, such as polymeric materials to include films, plastics, combinations, coextrusions, laminations, non-woven polymeric fabrics, cloth, paper, wool, etc. Also, while flexible substrates are preferred, semi-rigid or relatively rigid substrates can also be used including polyamide, polycarbonate, polyester, mylar, lexan, kevlar, cardboard, acrylics, acetate, foamed or foamable polymers, fiberboard, etc. Rigid substrates can be provided in many forms including for example, ceramics, glass, plastics, paper compositions, or composite substrates such as epoxy-fiberglass, epoxy-paper laminate, etc.

The conductive liquid printed according to the GRAVCO-PROCESS™ may be of any practical thickness, length, and width desired. The thickness may vary from one molecular layer to 200 microns, or even up to 500 microns if desired. Since the liquid can be made to be relatively free-flowing, very thin, closely-spaced components may be printed. This flexibility provides the circuit designer with a wide range of circuit component values which can be accommodated by the GRAVCO-PROCESS™.

5. The Articles

An extraordinarily wide variety of useful articles may be produced according to the GRAVCO-PROCESS™, and hence many products that have never been practical or cost-effective will become available as a result of this invention. For example, FIG. 6 depicts one article useful for the reliable dispensation of drugs. Some patients are forgetful or uncertain as to whether and when certain drugs have been or should be dispensed. A drug dispensation system in which it is positively known when the last drug was dispensed and when the next drug should be dispensed is quite important. FIG. 6 depicts a plan view of a drug dispenser article which may accurately and reliably schedule drug treatment. The circuit shown in FIG. 6 may be produced according to the GRAVCO-PROCESS™ described above, and its use will be described below. Drug dispenser article 200 has a plurality of electrodes 202 disposed along one edge thereof. The electrodes 202 are configured to be inserted into a computerized drug scheduler (not shown). Signal lines 204 extend from electrodes 202 and back to matching electrodes 206, making a continuous electrically conductive path from electrodes 202 to electrodes 206. The signal lines 204 include curvelinear portions 208 which are preferably disposed on aluminum foil immediately beneath a pill 210 contained within a plastic blister 212.

In order to dispense a pill, the patient pushes the pill 210 through the aluminum foil at the bottom of the article 200, thus severing signal line 208. The severing of the signal line 208 is detected by the computerized scheduler, and the time is noted therein. The computer now has a schedule indicating the identity of and time that each pill was removed from the article 200. The patient merely observes the display of the computerized scheduler to determine when the last drug was taken, and when the next drug is scheduled to be taken.

Figure 7:
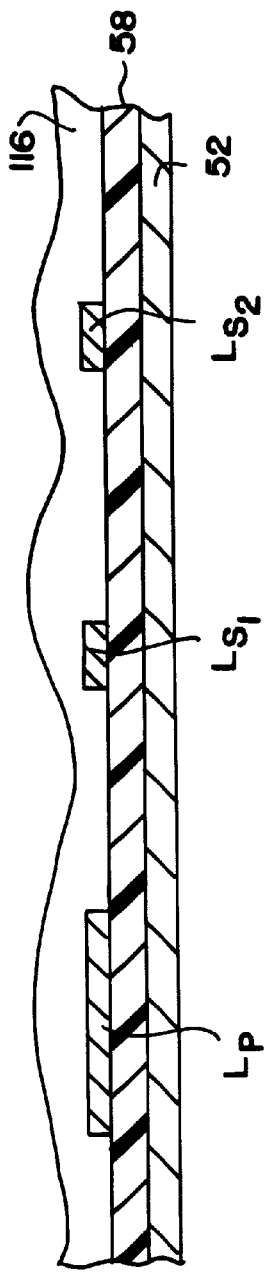
FIG. 7 is a cross-sectional view taken along line 7—7 of FIG. 6.

FIG. 7 is a cross-section view of a portion of the article 200 as viewed along lines 7—7, of FIG. 6. The flexible aluminum foil 52 has disposed thereon a dielectric coating 58, as has been described above with reference to FIG. 5. Signal lines $L_{S1}$ and $L_{S2}$ are deposited thereover and carry signals. A thicker line $L_P$ may be provided as a bus line for communication, as a circuit-matching resistor, or as a power line for carrying power, if required. Disposed over top of the signal lines is a protective coating 116 of, for example lacquer, as described earlier with respect to FIG. 5.

Figure 8:
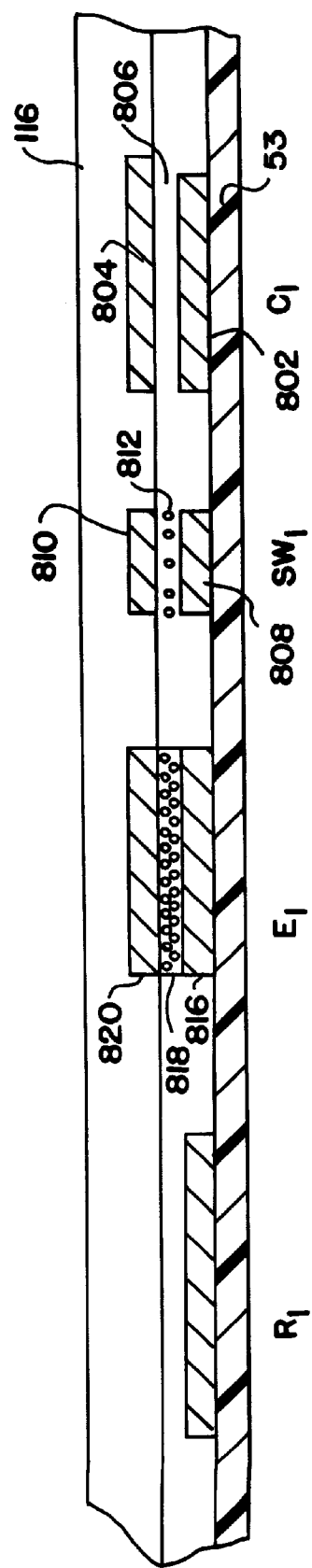
FIG. 8 is a cross-sectional view showing a number of electrical circuit components produced according to the present invention.

FIG. 8 is a cross-sectional view of a number of alternative circuit components which may be produced according to the GRAVCO-PROCESS™ described above. All circuits are depicted as being printed on a substrate layer 53, such as 1–2 mil polymeric plastic. A capacitor $C_1$ is provided having plates 802 and 804 separated by an insulating layer 806. The capacitor plates 802, 804 and the insulating layer 806 are dimensioned to produce the appropriate capacitance required for the circuit. Of course, the capacitor plates 802, 804 are coupled to other conductive circuitry (not shown).

A switch $SW_1$ is also shown in FIG. 8 and may comprise electrodes 808 and 810. The electrodes are separated by an insulating layer 812 which may comprise an insulating material having a plurality of voids or holes therein. Pushing down on electrode 810 will cause it to make contact with electrode 808, thus closing switch $SW_1$. If the insulating layer 812 has elastic properties, releasing pressure on electrode 810 will cause the switch to open.

Energy source (battery) $E_1$ is also shown in FIG. 8 and comprises electrode 816, electrolyte 818, and electrode 820. The electrolyte 818 preferably comprises micro-encapsulated liquid electrolyte (e.g., alkalines) which may also be deposited via the GRAVCO-PROCESS™ printing techniques described above. Alternatively, the electrolyte may comprise a liquid or a gel encased in a plastic blister which is deposited on the electrode 816 in an in-line process, as depicted in FIG. 5 for insulator 88. When the power source is ready for activation, the electrolyte 818 may be activated by the user pressing thereon, or some other process can be applied for causing the electrolyte 818 to make contact with both electrodes 816 and 820 (e.g., mechanical pressure, electrical activation, heating, photo-stimulation, etc.). Such a power source may be a simple short-term, one-shot power supply, or it may provide longer-lasting, higher-power similar to known 1.5-volt batteries, depending upon the number of electrodes and the type of electrolyte used. In a preferred embodiment, a battery may be printed by printing a carbon electrode on a substrate, depositing a dry alkaline on top of the carbon electrode, and printing a zinc electrode over the dry alkaline. The zinc will have a plurality of holes therein so that dipping the battery in water will liquidity the alkaline thus activating the electrolyte to power the battery. If higher voltages are needed, a plurality of such batteries may be connected in series, or an increase in battery current may be achieved by connecting a plurality of such batteries in parallel.

Also depicted in FIG. 8 is a simple resistor $R_1$ which may provide a resistance depending upon the thickness, width, length, and type of conductive liquid used therefor.

Figure 9:
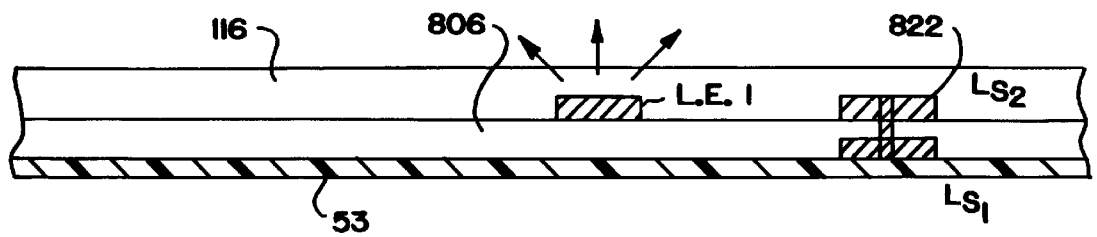
FIG. 9 is a cross-sectional view showing further electrical circuit components produced according to the present invention.

FIG. 9 depicts further articles which may be produced according to the GRAVCO-PROCESS™ described above. FIG. 9 shows how a through (or interconnect) hole 822 which may be provided between signal lines $L_{S1}$ and $L_{S2}$. The through hole 822 may be produced, for example, by the spiked roller 108 depicted in FIG. 5. FIG. 9 also depicts a light electrode LE1 which may, for example, comprise an electroluminescent layer. Upon application of the appropriate current, LE1 will emit photons for a time and intensity depending upon the composition of the solution and the applied current and voltage.

Figure 10:
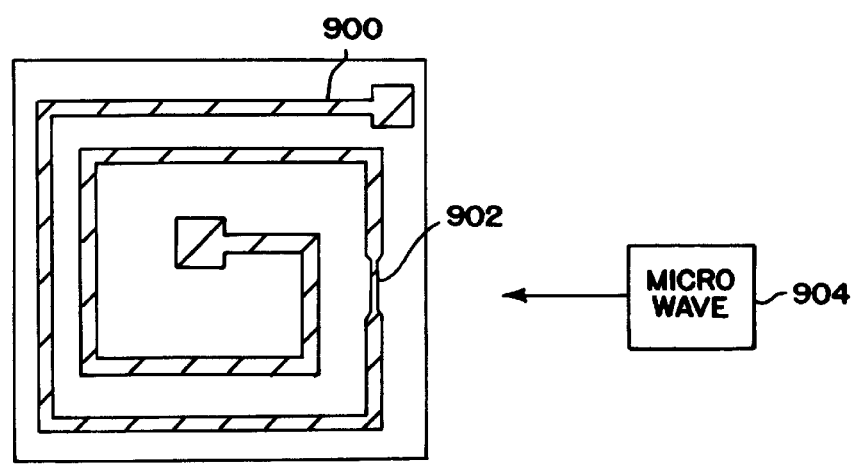
FIG. 10 is a plan view of an anti-theft detection tag and activator according to the present invention.

FIG. 10 depicts a theft-detection tag produced according to the GRAVCO-PROCESS™ described above. Such tags may also be used for registering inventory, identifying products, tracking hospital patients (newborns), anti-shoplifting, product labeling, etc. The anti-theft tag of FIG. 10 comprises a resonant circuit printed on both the top and bottom of an insulating substrate, for example, paper, cardboard, polymer films, nonwoven fabrics, cotton cloth, silk, etc. The top and bottom circuits may be connected by folding, welding, or interconnecting as described above with reference to FIG. 5. The resonant circuit comprises a conductive coil 900 having a thin, 1 mm long, 0.25 mm wide bridge-portion 902 disposed therein. When the theft-detection tag passes through a detector unit (not shown), RF energy emitted by the detector unit causes the circuit to resonate and act as a transmitter, giving off RF energy which may be detected by the detector. If the product has been properly purchased, a microwave capacitor 904 disposed near the cash register may emit a low-power microwave ray to burn and sever the bridge 902, thus decoupling the resonant circuit and permitting the tag to be removed from the store through the detector apparatus without alarm. Of course, other ways of decoupling the resonant circuit may be used, such as mechanical severing, magnetic alteration, etc. Very few articles of clothing currently have theft-detection circuits affixed thereto because known circuits are not cost-effective. However, according to the GRAVCO-PROCESS™, cotton or silk clothing labels bearing both product information and anti-theft circuitry may be produced in an in-line, high-speed process at low cost.

A wide variety of other articles may be produced according to the GRAVCO-PROCESS™ described above. For example, heating circuits can be printed on plastic sheeting which is laminated to a thermoformable plastic substrate, the laminate being subsequently thermoformed into a three dimensional product. Such a process can produce food trays made of foamed polymers may have heating circuits printed in the bottom thereof, so that food may be heated with an available electrical circuit, for example, a cigarette lighter in a car. Such a heating element may also be printed in coffee cups, soup cups, hot cereal containers, baby bottles, etc. The circuit need only have two electrodes and an appropriate number of resistors disposed near the product to be heated. Also, food products can be heated within flexible pouches with printed heating elements.

Other heating applications are also susceptible to the GRAVCO-PROCESS™ described above. For example, space heaters (e.g., for use in a van or trailer) may be produced by thermoforming large sheets of a semi-rigid substrate (e.g., foamable polymeric composites). Printed on the substrate (prior to thermoforming) would be a plurality of heating elements produced according to the GRAVCO-PROCESS™. The heating elements could be readily configured to provide high heat or low heat and for a particular space desired. The heating elements could even be produced in interconnectable modular form. Power could be provided through a vehicle cigarette lighter, from a vehicle alternator, or from a wall outlet for use in a building space heater.

Heating elements may also be printed on cloth or on the non-woven polymer fabrics discussed above. This could result in inexpensive heated products such as heated blankets, heated towels, heated socks, heated mittens, heated caps, heated clothes, heated automobile seats, heated furniture, etc.

Furthermore, large sheets of polyethylene having heated elements printed thereon may be produced for use in hot houses for personal or commercial use. The heating elements may be designed to produce a wide range of btu's depending on the type of hot house being assembled.

Alternatively, electrical circuits produced according to the GRAVCO-PROCESS™ may be used to cool products. It is well known that semi-conductor materials (P-N junctions) may generate heat or absorb heat depending upon the current (and direction of current) applied thereto. All of the above-noted heating applications may have complementary cooling applications which can be satisfied according to the electrical circuits produced by the GRAVCO-PROCESS™. As one example, the foam labels adhered to soda bottles may have circuitry printed therein to absorb heat from the bottle, thus cooling the liquid. The cooling circuitry may be coupled to an external power source, or a power source may be printed into the label, as described above. Thus, the GRAVCO-PROCESS™ may produce a great number of products capable of being heated and/or cooled.

Electrically conductive liquids may also be printed according to the GRAVCO-PROCESS™ on documents requiring authentication, such as bonds, stocks, currency, etc. Electrical circuitry having particular characteristics may be printed on the document and later verified with a small electrical authenticator which ascertains the characteristics of the electrical circuit printed on the document.

Furthermore, electrically conductive liquids may be printed according to the GRAVCO-PROCESS™ to perform the function of product registration in well-known in-line bag-making, sheeting, or pouch-making processes and in any process requiring position detecting and triggering. Currently, a large black or dark registration mark is provided on a bag web. An optical reader determines the location of the registration mark to control the feeding, and cutting of the printed web. However, optical readers are susceptible to dirt and other reliability problems. By using a conductive ink as a small registration mark, a small roller (or wheel) with one or more electrodes thereon may be used to detect the passage of the conductive ink registration mark, e.g., with a continuity check.

Microwave susceptors may also be printed into products to be used in microwave ovens, such as microwave popcorn bags or boxes (plastic or paper). Currently, microwave susceptors must be mechanically (or manually) inserted into pouches or between layers of a microwave container, (e.g., a popcorn bag). With the GRAVCO-PROCESS™, such susceptors may be printed on or within container layers in an in-line, low-cost process. Indeed, the GRAVCO-PROCESS™ may combine printing electrically conductive circuits with ornamental labels, as discussed earlier. Thus, the name of the microwave popcorn manufacturer may be printed with an electrically-conductive liquid so that the manufacturer's name itself acts as a microwave susceptor.

Electroluminescent liquids may be advantageously used in light-up displays attractive to the consumer. For example, soda cans may be printed with electroluminescent liquids, power lines, and terminals using the GRAVCO-PROCESS™ described above. The soda can display at the store may have matching electrodes and a power source such that the displayed soda cans actually light up with the manufacturer's name and/or trademark.

Furthermore, tamper-evident packaging may also be created utilizing electrical circuits produced by the GRAVCO-PROCESS™ described above. For example, signal lines may be printed on shrink-wrap product coverings such that the signal lines break to show tampering. A simple circuit located at the cash register would be used to detect broken signal lines indicating that the package had been tampered with.

As described above, any known or useful electrical circuit can be produced according to the GRAVCO-PROCESS™ including, but not limited to, signal lines, power lines, connectors, switches, antennas, induction heaters, radiant heaters, coolers, radiation reflectors, diodes, capacitors, transistors, resistors, inductors, coils, batteries, sensors, fuel cells, piezoelectric elements, light emitting circuits, photovoltaic cells, photo-imaging cells, etc.

6. Conclusion

Thus, what has been described above is a method and apparatus for the high-speed mass production of electrical circuit components by directly printing electrically conductive liquids onto a substrate without post-printing processes. The GRAVCO-PROCESS™ is far superior to the best-known printed circuit board techniques, such as silk-screen. The GRAVCO-PROCESS™ can produce printed circuit boards 10–50 times faster than silk-screen processes. The precision and geometric tolerances produced according to the present invention are also far superior to silk-screening since a stencil does not have to be pulled away from the substrate allowing the thick ink to cause dispersion at the edges. The silk-screen process can produce signal lines on the order of 500 microns wide, whereas the present invention can produce signal lines tolerances an order of magnitude narrower. Silk-screen inks are also quite expensive, from 600–700 dollars per pound, orders of magnitude more expensive than the conductive liquid according to the present invention. In addition, a large amount of ink wastage is seen in silk-screen processes, where the present invention will waste very little ink. The present invention can miniaturize or downsize circuits because the direct printing process can produce much finer and smaller dimensions than silk-screen stencils. For example, silk-screen processes can only approximately space signal lines approximately 2 millimeters apart, whereas the present invention can space signal lines approximately 0.1 millimeters apart. Further, the GRAVCO-PROCESS™ can easily produce multi-layer circuitry, whereas silk screening can only produce a single layer. Finally, silk-screen processes cannot print circuit boards on flexible substrates, whereas the present invention can print on one mil flexible substrates such as plastic, paper, or aluminum foil. Accordingly, the present invention can produce electrical circuit components and/or electrical circuits at a fraction of the cost and in a fraction of the time of the best-known current printed circuit board techniques.

While the present invention has been described with what are presently considered to be the preferred embodiments, the claims are not to be limited to the disclosed embodiments. To the contrary, the claims are intended to cover various modifications and equivalent structures and functions as are apparent from the appended claims.

What is claimed is:

1. An electrical circuit component, comprising:
   a flexible substrate;
   a first insulation layer;
   an aluminum layer disposed between said flexible substrate and said first insulation layer;
   a second insulation layer disposed between said first insulation layer and said aluminum layer; and
   a rotogravure-printed electrical circuit element disposed between said first insulation layer and said second insulation layer, said circuit element comprising a matrix pattern of conductive ink, which pattern is electrically conductive in both a printing direction and a transverse direction.

2. A component according to claim 1, wherein said circuit element is electrically-conductive in a printing direction and in a direction transverse thereto.

3. A component according to claim 2, wherein said circuit element comprises uniform and continuous electrical pathways in both the printing direction and in the transverse direction.

4. A component according to claim 1, wherein said circuit element includes silver particles.

5. A component according to claim 1, wherein said circuit element comprises a resistor.

6. A component according to claim 1 further comprising:
   a rotogravure-printed thermochromic layer disposed adjacent either said first insulation layer or said second insulation layer so as to receive heat from said circuit element; and
   a third insulation layer disposed adjacent said thermochromic layer.

7. A component according to claim 6, wherein the thermochromic layer is disposed over said first insulation layer.

8. A component according to claim 1, wherein said first insulation layer has at least one hole therein, and further comprising a switch for making electrical contact through the at least one hole in said first insulation layer.

9. A component according to claim 8, wherein said switch comprises a push switch.

10. A component according to claim 1 wherein said circuit element includes a polymeric resin and a material for providing flexibility to said circuit element.

11. A component according to claim 10, wherein said material comprises a plasticizer.

12. A component according to claim 1, wherein said aluminum layer is adhered to said flexible substrate.

13. A component according to claim 1, wherein said second insulation layer is transparent.

14. A component according to claim 1, wherein said flexible substrate comprises a polymeric film.

15. A component according to claim 1, wherein said conductive ink includes a plasticizer.

16. An electrical circuit component comprising:
    a flexible layer;
    a first flexible insulation layer having at least one hole therein;
    a rotogravure-printed resistor disposed between said first flexible insulation layer and said flexible layer and over said hole, said resistor having a plurality of dried, silver-containing ink cells disposed in a matrix pattern and electrically conductive in a printing direction and in a direction transverse thereto;
    a second flexible insulation layer disposed between said resistor and said flexible layer;
    a thermochromic layer disposed adjacent to either said first insulation layer or said second insulation layer so as to receive heat from said resistor; and
    the resistor and the hole in the first flexible insulation layer forming a push switch such that when a portion of the resistor is pushed through the hole to make contact with a conductive material on the other side of the hole, current flows through the switch causing the resistor to generate heat which causes a change in visual appearance of the thermochromic layer.

17. A component according to claim 16, wherein the resistor comprises more than one layer of conductive ink.

18. A component according to claim 16, wherein said resistor comprises silver particles, a polymeric resin, and a material which imparts flexibility to said resistor.

19. A component according to claim 18, wherein said material comprises a plasticizer.

20. A component according to claim 16, further comprising a plurality of said electrical circuit components disposed side-by-side in the transverse direction on a flexible plastic web.

21. A component according to claim 16, wherein at least one of said first and second flexible insulation layers has graphical printing ink disposed thereon to form a label.

22. A component according to claim 16, wherein said conductive ink includes a plasticizer.

23. A printed electrical circuit element, comprising:
    a flexible polymeric sheet;
    a rotogravure-printed resistor printed on one side of said polymeric sheet, said resistor having a plurality of dried, silver-ink cells disposed in a matrix pattern and which are electrically conductive with each other in a printing direction and in a direction transverse thereto to provide electrical conductivity in the resistor in both the printing direction and in the transverse direction;
    a flexible insulation layer disposed on an opposite side of said resistor from said polymeric sheet, said insulation layer having at least one hole therein, said hole being adjacent to a portion of said resistor;
    a rotogravure-printed thermochromic layer printed on an opposite side of said polymeric sheet from said resistor so to receive heat from said resistor; and
    a flexible protective layer disposed on an opposite side of said thermochromic layer from said resistor, said portion of said resistor and the hole in the insulation layer forming a push switch such that when said portion of said resistor is pushed through said hole to make contact with one pole of an electrical power source, and when another portion of said resistor makes contact with a second pole of the power source, current flows through said resistor causing said resistor to generate heat which causes a change in a visual appearance of said thermochromic layer.

24. An element according to claim 23, wherein said conductive ink includes a plasticizer.

* * * * *